(12) United States Patent
Chen et al.

(10) Patent No.: US 6,380,564 B1
(45) Date of Patent: Apr. 30, 2002

(54) SEMICONDUCTOR LIGHT EMITTING DEVICE

(75) Inventors: Tzer-Perng Chen; Rong-Yih Hwang; Charng-Shyang Jong, all of Hsinchu (TW)

(73) Assignee: United Epitaxy Company, Ltd. (TW)

( * ) Notice: Subject to any disclaimer, the term of this patent is extended or adjusted under 35 U.S.C. 154(b) by 63 days.

(21) Appl. No.: 09/639,100

(22) Filed: Aug. 16, 2000

(51) Int. Cl.⁷ ............................................. H01L 33/00
(52) U.S. Cl. ........................ 257/99; 257/94; 257/96
(58) Field of Search ........................... 257/81, 85, 91, 257/94, 95, 96, 99

(56) References Cited

U.S. PATENT DOCUMENTS

| | | | | |
|---|---|---|---|---|
| 3,675,064 A | * | 7/1972 | Coleman et al. | 313/108 B |
| 5,309,001 A | * | 5/1994 | Watanabe et al. | 257/99 |
| 5,459,337 A | * | 10/1995 | Ito et al. | 257/89 |
| 6,097,040 A | * | 8/2000 | Morimoto et al. | 257/91 |
| 6,221,684 B1 | * | 4/2001 | Sugawara et al. | 438/47 |

* cited by examiner

Primary Examiner—Sara Crane

(57) ABSTRACT

A semiconductor light emitting device has a transparent substrate, an n-type semiconductor layer, a p-type semiconductor layer, an n-type transparent electrode, a p-type transparent electrode, an n-type bonding pad, and a p-type bonding pad. The n-type semiconductor layer is disposed over the transparent substrate. The p-type semiconductor layer and the n-type transparent electrode are provided on the n-type semiconductor layer and arranged alternatively to each other, where the p-type semiconductor layer and the n-type transparent electrode cover different portions of the n-type semiconductor layer respectively. The p-type transparent electrode is provided in contact with the p-type semiconductor layer. The n-type and p-type bonding pads are disposed on the n-type and p-type transparent electrodes respectively, and the areas of these bonding pads are smaller than the area of the corresponding electrodes.

43 Claims, 3 Drawing Sheets

SEMICONDUCTOR LIGHT EMITTING DEVICE

FIELD OF THE INVENTION

The present invention relates to a semiconductor light emitting device, and more particular to a light emitting diode (LED) with transparent electrodes disposed alternatively to each other.

BACKGROUND OF THE INVENTION

The semiconductor light emitting device is a semiconductor device which can be used to convert electrical energy into light. The semiconductor light emitting device is composed of semiconductor materials with different conductivity types such as n-type and p-type semiconductor material. In the n-type semiconductor materials, the electrons in the outer shell of atoms can move freely as the carriers of current. The n-type semiconductor materials include the elements of the V group such as phosphorous (P), arsenic (As), antimony (Sb), etc. The carrier in the n-type semiconductor material is the so-called donor. On the other hand, in the p-type semiconductor materials, the atoms possess holes because of lack of electrons, where the holes can also be the carriers. The p-type semiconductor materials include the elements of the III group such as aluminum (Al), gallium (Ga), indium (In), etc. The carrier in the p-type semiconductor material is the so-called acceptor.

As the n-type and p-type semiconductor materials joining to form a composite material, the electrons and the holes would redistribute in the composite material where the p-n junction is formed between the n-type and p-type materials. The carriers in the materials with different conductivity types would cross the p-n junction when the forward bias is applied to the electrodes on the composite material. In another word, the basic principle of the light emitting diode is that the holes in p-type material and the electrons in n-type material are combined in the neighborhood of the p-n junction and the energy is released in photons under forward bias.

FIG. 1A and FIG. 1B are the cross-sectional view and the top view of a conventional blue light emitting diode respectively. FIG. 1A is the cross-sectional view of FIG. 1B along the cross-section I-I for the conventional light emitting diode presented by Nichia Chemical Industries, LTD.

As shown in FIG. 1A, in the conventional blue light emitting diode 100, an n-type gallium nitride (n-GaN) 104 is provided on the surface of the sapphire substrate 102. A p-type gallium nitride (p-GaN) 106 for forming the p-type mesa is provided on the n-GaN 104 and covers a portion of the surface of the n-GaN 104. The upper surface of the p-type mesa 106 is covered completely by a p-type transparent metal electrode 108 of combined nickel/gold (Ni/Au) structure. An n-type bonding pad 110 and a p-type bonding pad 112 act as joints for electrical connection while wire bonding (W/B) performed, where the n-type bonding pad 110 is disposed on the exposed surface of n-GaN 104 and the p-type bonding pad 112 is located on the p-type transparent metal electrode 108.

As the top view of the conventional blue light emitting diode 100 shown in FIG. 1B, the p-type mesa 106 is located on the square n-GaN 104. The p-type mesa 106 covers a portion of the square surface of the n-GaN 104, and the p-type transparent metal electrode 108 covers the upper surface of the p-type mesa 106 completely. The n-type bonding pad 110 and the p-type bonding pad 112 are located on the diagonal of the square surface of the blue light emitting diode 100 respectively.

The n-type bonding pad 110 and p-type bonding pad 112 must be disposed for electrical connecting to the n-GaN 104 and p-GaN 106 respectively, since the transparent sapphire substrate is an electrical insulating substrate. The region of light emission is limited around the p-type bonding pad 112 due to the position of the n-type bonding pad 110 and p-type bonding pad 112 as the connection electrodes. The conductivity of the p-GaN 106 formed on the n-GaN 104 is worse on account of the characteristic on growth of p-type material. Thus the p-type transparent metal electrode 108 is disposed between the p-GaN 106 and the p-type bonding pad 112 for of current spreading. The conventional blue light emitting diode 100 can illuminate entirely as the current spread by the p-type transparent electrode 108 and flowing into the p-GaN 106.

Because of the bonding pads regarded as connection electrodes and the resistivity of the p-type transparent metal electrode 108, the lengths of current paths on the p-type transparent metal electrode 108 between the n-type bonding pad 110 and the p-type bonding pad 112 are different, which causes the non-uniform emission and other problems in the square light emitting diode 100. Furthermore, the light emitting efficiency of the conventional device is diminished since the light emitted from the device is obstructed by the n-type bonding pad 110 composed of thick oblique metal layer.

SUMMARY OF THE INVENTION

In view of the above, one aspect of the present invention is to provide a semiconductor light emitting device in which the characteristic of current spreading is improved by the configuration of electrodes and the property of materials. The semiconductor light emitting device is provided with an n-type transparent electrode and a p-type transparent electrode arranged alternatively to each other, which results in improvement of current spreading, decrease of the operation voltage, increase of the light emitting efficiency and the uniformity of the luminous figures.

In another aspect, the present invention provides a light emitting diode in which the current spreading is improved with the configuration of electrodes and the enhancement of the materials. An n-type transparent electrode and a p-type transparent electrode are arranged alternatively to each other on the light emitting diode to improve the current spreading, decrease the operation voltage, increase the efficiency and the uniformity of light emission.

In a further aspect, the present invention provides a blue light emitting diode in which the current spreading is uniform, the operation voltage is decreased, and the light emitting efficiency and the uniformity of luminous figures are increased. In the blue light emitting diode including n-GaN and p-GaN, there are an n-type transparent electrode and a p-type transparent electrode arranged alternatively to each other on the blue light emitting diode, an n-type bonding pad and a p-type bonding pad with smaller areas are disposed on the n-type transparent electrode and p-type transparent electrode respectively.

To achieve these and other advantages and in accordance with the purpose of the invention, as embodied and broadly described herein, the present invention provides a semiconductor light emitting device. The semiconductor light emitting device includes a substrate covered by a first layer. Both a second layer and a first transparent electrode are disposed on the first layer to cover different portions of the surface and arranged alternatively to each other. A second transparent electrode is provided in contact with the second layer. A first bonding pad and a second bonding pad are disposed on the first and the second transparent electrodes respectively.

Moreover, according to the aspects of the present invention, a light emitting diode is disclosed, wherein the light emitting diode includes a transparent substrate, an n-type semiconductor layer, a p-type semiconductor layer, an n-type transparent electrode, a p-type transparent electrode, an n-type bonding pad and a p-type bonding pad. The p-type semiconductor layer and the n-type transparent electrode are provided on the n-type semiconductor layer and arranged alternatively to each other, where the n-type semiconductor layer is disposed on the transparent substrate. The p-type semiconductor layer and the n-type transparent electrode cover different portions of the n-type semiconductor layer respectively. The p-type transparent electrode is provided in contact with the p-type semiconductor layer. The n-type and p-type bonding pads are located on the n-type and p-type transparent electrodes respectively.

Furthermore, the present invention discloses a blue light emitting diode including a transparent sapphire substrate covered by an n-type gallium nitride layer. A p-type gallium nitride layer and an n-type transparent electrode are disposed on different portions of the n-type gallium nitride surface and arranged alternatively with each other. A p-type transparent electrode is provided in contact with the surface of the p-type type gallium nitride layer. An n-type and a p-type bonding pad are located on the n-type and the p-type transparent electrodes respectively.

It is to be understood that both the foregoing general description and the following detailed description are exemplary, and are intended to provide further explanation of the invention as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1A:
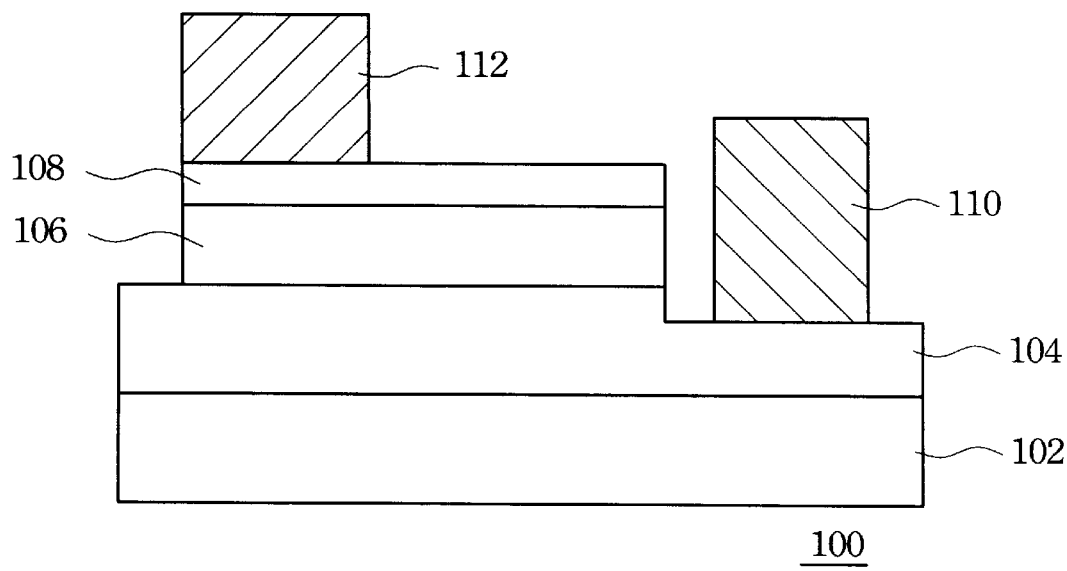
FIG. 1A is a cross-sectional view of a conventional blue light emitting diode.
Figure 1B:
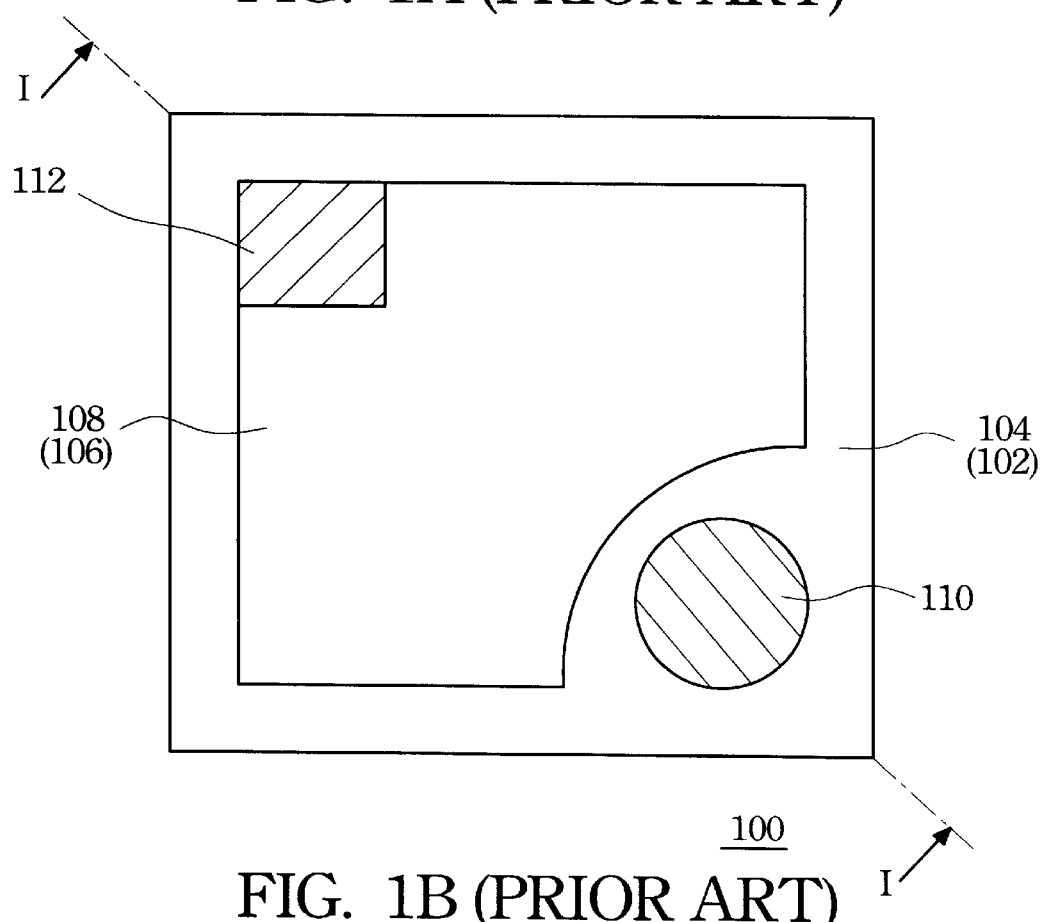
FIG. 1B is a top view of the conventional blue light emitting diode shown in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
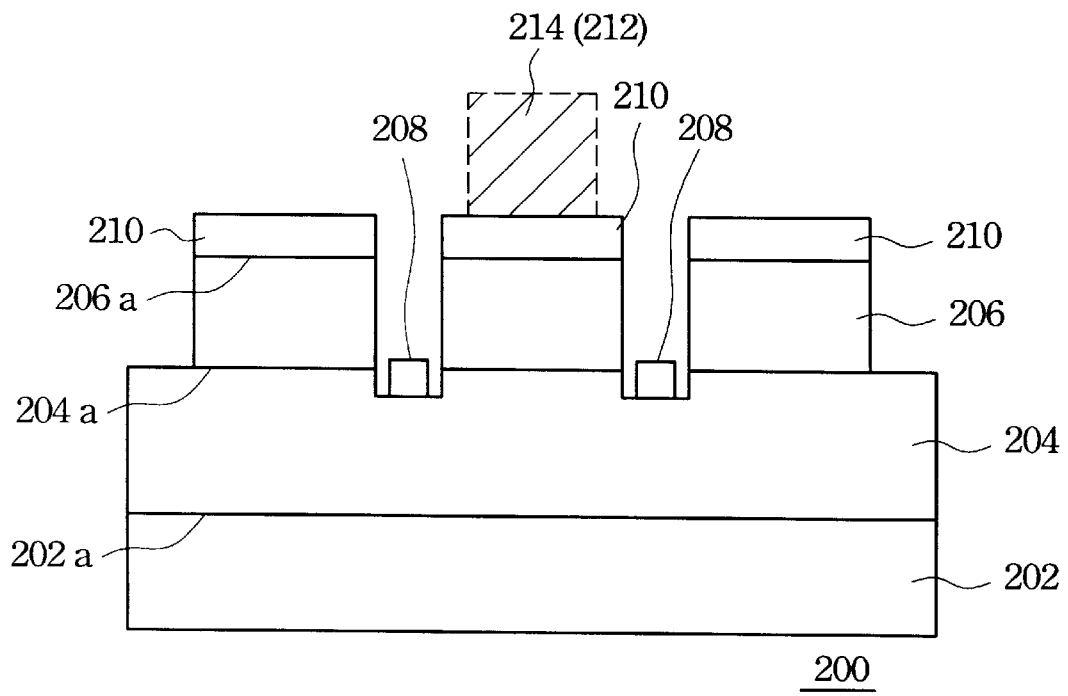
FIG. 2A is a cross-sectional view showing the structure of a semiconductor light emitting device according to a first embodiment of the present invention.
Figure 2B:
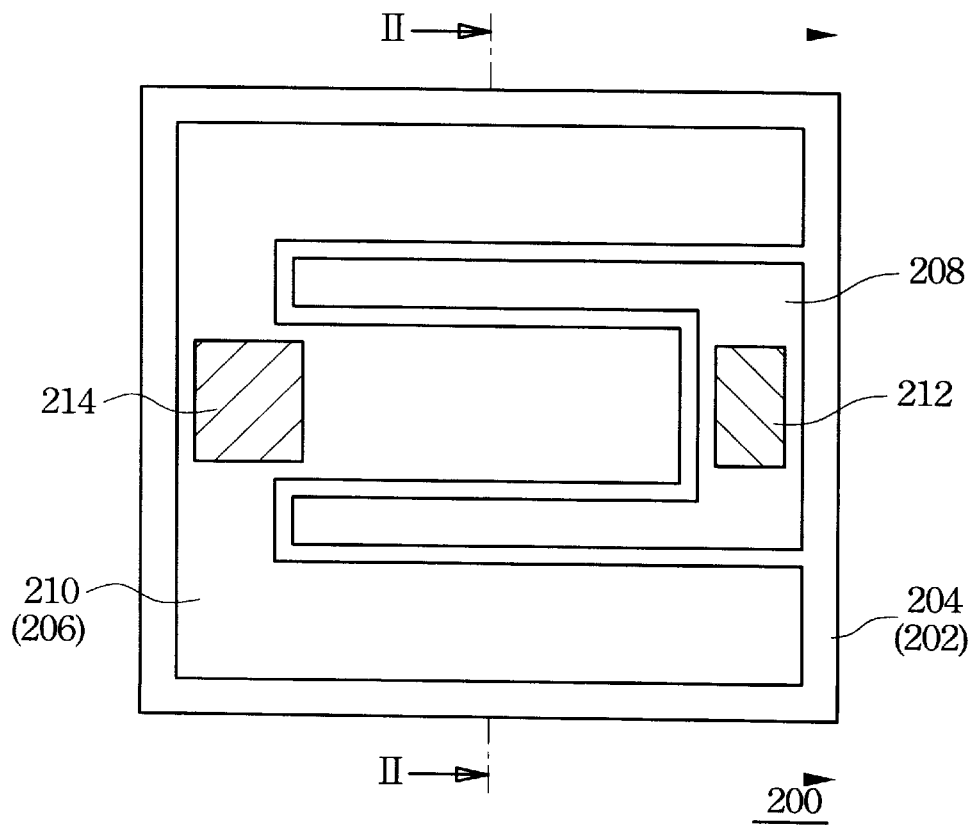
FIG. 2B is a top view of the semiconductor light emitting device shown in FIG. 2A.

FIG. 2A and FIG. 2B schematically illustrate cross-sectional and top views of a semiconductor light emitting device according to a preferred embodiment of the present invention, where FIG. 2A is a cross-sectional view of FIG. 2B along the cross-section II—II.

As shown in FIG. 2A, a semiconductor light emitting device 200 of the present invention includes a substrate 202, a first layer 204, a second layer 206, a first transparent electrode 208, a second transparent electrode 210, a first bonding pad 212, and a second bonding pad 214. The semiconductor light emitting device 200 includes light emitting diode, such as the light emitting diodes can emit lights of different colors individually. The first layer 204 is disposed on the surface 202a of the substrate 202. The second layer 206 is located on the surface 204a of the first layer 204 and covers portion of the surface 204a thereof. The substrate 202 includes a transparent substrate such as transparent sapphire substrate. Material for forming the first layer 204 includes the n-type semiconductor material such as n-type gallium nitride (n-GaN). And material for forming the second layer 206 includes the p-type semiconductor material such as p-type gallium nitride (p-GaN).

In FIG. 2A, the structure of the second layer 206 covering portion of the surface 204a includes a comb-like structure. For example, the structure of the second layer 206 is of "M" shape. The first transparent electrode 208 is disposed on the portion of the surface 204a which is not covered by the second layer 206, where the thickness of the first transparent electrode 208 is about ten angstrom to about several hundred angstrom. The structure of the first transparent electrode 208 is corresponding and complementary to the second layer 206, such as the comb-like structure corresponding and complementary to the second layer 206 relatively. That is to say, the second layer 206 and the first transparent electrode 208 on the surface 204a are arranged alternatively to each other without connection and cover different portions of the surface 204a.

The first transparent electrode 208 includes a transparent electrode with the characteristic of n-type semiconductor material, such as a transparent electrode includes a single-layer of metal or multi-layer of metals as a stacked-layer structure. Material for forming the first transparent electrode 208 includes metals of low work function such as aluminum (Al), indium (In), titanium (Ti), tantalum (Ta) and an alloy of the metals mentioned above. Material for forming the first transparent electrode 208 also includes oxides such as indium tin oxide (ITO), titanium oxide (TiO), nickel oxide (NiO), cobalt oxide (CoO) or a composite material containing various combinations of the oxides above. Material for forming the first transparent electrode 208 further includes nitrides such as aluminum nitride (AlN), indium nitride (InN), titanium nitride (TiN), tantalum nitride (TaN) or a composite material containing various combinations of the nitrides above.

The second transparent electrode 210 is located on the second layer 206 and covers the surface 206a of the second layer 206 completely. The first transparent electrode 208 and the second transparent electrode 210 are disposed without connecting to each other. The shape of the second transparent electrode 210 is the same as the second layer 206. The second transparent electrode 210 includes a transparent electrode with the characteristic of p-type semiconductor material. Material for forming the second transparent electrode 210 includes thin metal layer such as a layer of Ni/Al bi-layer structure.

FIG. 2B is a schematic top view of the semiconductor light emitting device 200 in FIG. 2A. As shown in FIG. 2B, the first layer 204 is disposed on the substrate 202 to cover the substrate surface. The second layer 206 and the first transparent electrode 210 are located on the first layer 206 and cover different portions of the substrate surface respectively. The structures of the second layer 206 and the first transparent electrode 210 are corresponding and complementary to each other. For example, both the second layer 206 and the first transparent electrode 210 are of the comb-like structures corresponding and complementary to each other without connection. The second transparent electrode 210 and the second layer 208 are of the same shape, where the second transparent electrode 210 is provided in contact with the second layer 208 to cover the surface of the second layer 206 completely. The first transparent electrode 208 and the second transparent electrode 210 are disposed without connection.

In FIG. 2B, there are the first bonding pad 212 and the second bonding pad 214 located on the first transparent electrode 208 and the second transparent electrode 210 respectively. The first bonding pad 212 and the second bonding pad 214 are the joints of the semiconductor light emitting device 200 for electrical connection with external while wire bonding (W/B) or flip chip (F/C) performed. The areas of the first bonding pad 212 and the second bonding pad 214 are smaller than the areas of the first transparent electrode 208 and the second transparent electrode 210 respectively. The first bonding pad 212 and the second bonding pad 214 can have various shapes and locations in accordance with the consideration on the uniformity of current spreading. Material of the bonding pads includes metal, and the bonding pads can be composed of two or more layers of metal. For example, the inner layer of the bonding pad attached to the transparent electrode is made of nickel and the outer layer of the bonding pad is made of gold. The thickness of the bonding pad is about several thousand angstrom to about several micron.

Figure 3:
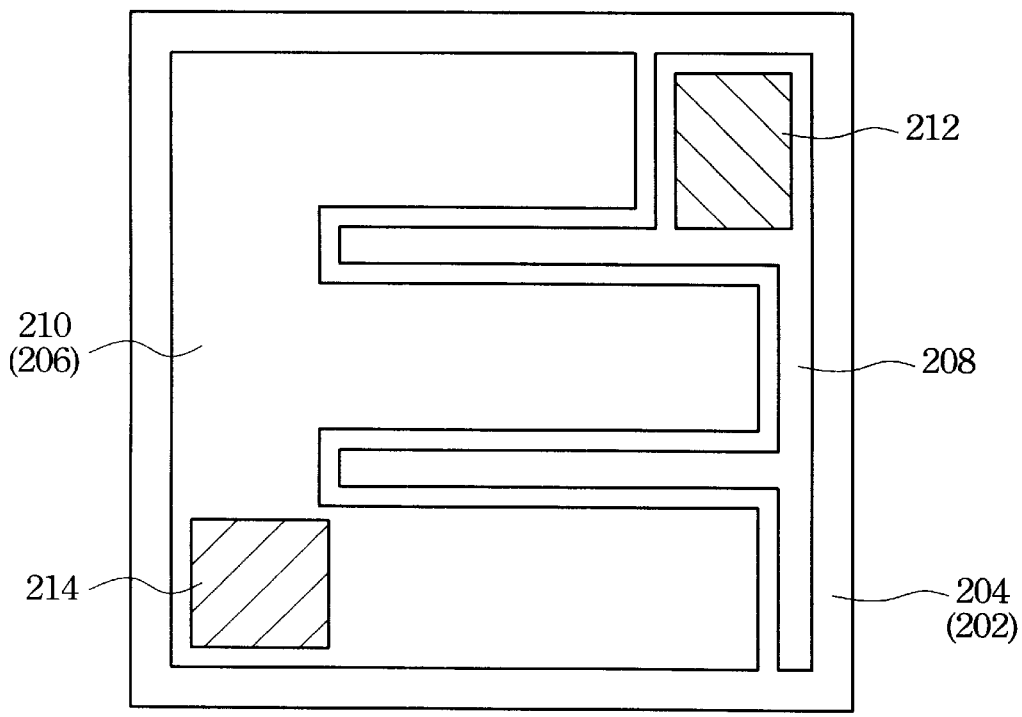
FIG. 3 is a top view of the semiconductor light emitting device according to a second embodiment of the present invention.
Figure 4:
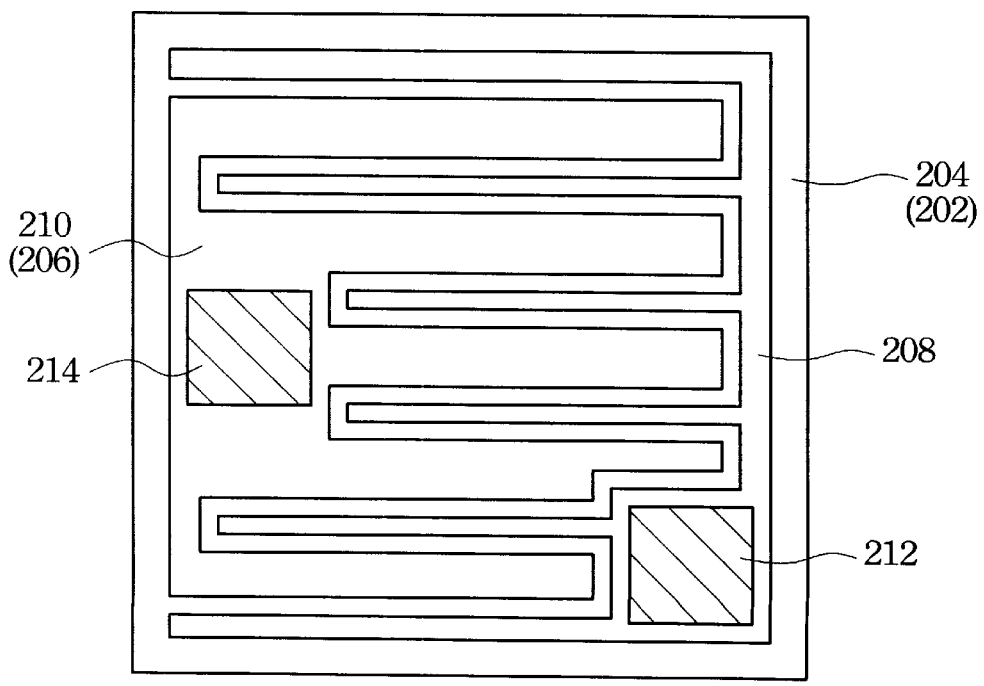
FIG. 4 is a top view of the semiconductor light emitting device according to a third embodiment of the present invention.

Referring to FIG. 3 and FIG. 4, there are cross-sectional views of two other semiconductor light emitting devices according to different preferred embodiments of the present invention. The different configurations of the first transparent electrode, the second layer, and the second transparent electrode are illustrated in FIG. 2B, FIG. 3, and FIG. 4, where the same reference numbers are used in the drawings and the description to refer to the same or like parts. In addition, the configurations shown in FIG. 2B, FIG. 3, and FIG. 4 are examples and not to limit the scope of the present invention. The configurations of the first transparent electrode, the second layer, and the second transparent electrode, which are arranged alternatively, can be varied in accordance with the consideration on the uniformity of current spreading, such as thread-like, net-like, block-like or other configurations.

The semiconductor light emitting device of the present invention can be applied to a light emitting diodes which can emit lights with different wavelengths respectively. From the above embodiment, the present invention has at least the following characteristics:

1. An n-type transparent electrode is provided in the semiconductor light emitting device, which result in uniformity of current spreading and decrease of operation voltage. Providing the n-type transparent electrode can increase the contact area and obtain better Ohmic contact with the n-type semiconductor material because the n-type semiconductor material possesses higher concentration of dopant and lower resistivity.

2. The n-type and p-type transparent electrodes are arranged alternatively to each other in the semiconductor light emitting device, which facilitates the current spreading on the surface of the device to increase the uniformity of current spreading and light emission and decrease operation voltage.

3. The mesa of p-type semiconductor material on the n-type semiconductor material can be altered to get the best uniformity on luminous figures, since the n-type electrode is transparent.

4. The shapes and locations of the n-type and p-type bonding pads can be varied in accordance with the size of the device, the shape of the transparent electrodes, and the requirements of electrical connection and device package.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A semiconductor light emitting device, comprising:
    a substrate having a first surface;
    a first layer disposed on the first surface, wherein the first layer having a second surface such that the first layer is located between the first surface and the second surface;
    a second layer disposed on the first layer and covers a portion of the second surface, wherein the second layer having a third surface such that the second layer is located between the second surface and the third surface;
    a first transparent electrode disposed on the first layer, wherein the first transparent electrode is arranged alternatively to the second layer without connection and covers a portion of the second surface;
    a second transparent electrode disposed on the second layer, such that the second layer is located between the first layer and the second transparent electrode, wherein the second transparent electrode covers the third surface completely;
    a first bonding pad disposed on the first transparent electrode and electrically connected to the first transparent electrode; and
    a second bonding pad disposed on the second transparent electrode and electrically connected to the second transparent electrode.

2. The semiconductor light emitting device of claim 1, wherein the materials of the substrate comprise a sapphire.

3. The semiconductor light emitting device of claim 1, wherein materials of the first layer comprise an n-type semiconductor.

4. The semiconductor light emitting device of claim 1, wherein the materials of the second layer comprise a p-type semiconductor.

5. The semiconductor light emitting device of claim 1, wherein the structures of the second layer comprise a comb-like structure.

6. The semiconductor light emitting device of claim 5, wherein the structures of the first transparent electrode comprise a comb-like structure corresponding and complementary to the second layer relatively.

7. The semiconductor light emitting device of claim 1, wherein the second transparent electrode is arranged alternatively to the first transparent electrode without connection.

8. The semiconductor light emitting device of claim 1, wherein the materials of the first transparent electrode comprise a single metal layer.

9. The semiconductor light emitting device of claim 1, wherein the materials of the first transparent electrode comprise a plurality of metal layers.

10. The semiconductor light emitting device of claim 1, wherein the material of the first transparent electrode is selected from a group consisting of aluminum, indium, titanium, tantalum and an alloy of the above listed metals.

11. The semiconductor light emitting device of claim 1, wherein the materials of the first transparent electrode comprise oxides.

12. The semiconductor light emitting device of claim 11, wherein the material of the first transparent electrode is selected from a group consisting of indium tin oxide, titanium oxide, nickel oxide, cobalt oxide and a combination of the above listed oxides.

13. The semiconductor light emitting device of claim 1, wherein the materials of the first transparent electrode comprise nitrides.

14. The semiconductor light emitting device of claim 13, wherein the material of the first transparent electrode is selected from a group consisting of aluminum nitride, indium nitride, titanium nitride, tantalum nitride and a combination of the above listed nitrides.

15. The semiconductor light emitting device of claim 1, wherein the area of the first bonding pad is smaller than the area of the first transparent electrode.

16. The semiconductor light emitting device of claim 1, wherein the area of the second bonding pad is smaller than the area of the second transparent electrode.

17. A light emitting diode, comprising:
a transparent substrate having a first surface;
an n-type semiconductor layer disposed on the first surface, wherein the n-type semiconductor layer having a second surface such that the n-type semiconductor layer is located between the first surface and the second surface;
a p-type semiconductor layer disposed on the n-type semiconductor layer and covers a portion of the second surface, wherein the p-type semiconductor layer having a third surface such that the p-type semiconductor layer is located between the second surface and the third surface;
an n-type transparent electrode disposed on the n-type semiconductor layer, wherein the n-type transparent electrode is arranged alternatively to the p-type semiconductor layer without connection and covers a portion of the second surface;
a p-type transparent electrode disposed on the p-type semiconductor layer, such that the p-type semiconductor layer is located between the n-type semiconductor layer and the p-type transparent electrode, wherein the p-type transparent electrode covers the third surface completely;
an n-type bonding pad disposed on the n-type transparent electrode and electrically connected to the n-type transparent electrode; and
a p-type bonding pad disposed on the p-type transparent electrode and electrically connected to the p-type transparent electrode.

18. The light emitting diode of claim 17, wherein the materials of the transparent substrate comprise a sapphire.

19. The light emitting diode of claim 17, wherein materials of the n-type semiconductor layer comprise an n-type gallium nitride.

20. The light emitting diode of claim 17, wherein the materials of the p-type semiconductor layer comprise a p-type gallium nitride.

21. The light emitting diode of claim 17, wherein the structures of the p-type semiconductor layer comprise a comb-like structure.

22. The light emitting diode of claim 21, wherein the structures of the n-type transparent electrode comprise a comb-like structure corresponding and complementary to the p-type semiconductor layer relatively.

23. The light emitting diode of claim 17, wherein the p-type transparent electrode is arranged alternatively to the n-type transparent electrode without connection.

24. The light emitting diode of claim 17, wherein the materials of the n-type transparent electrode comprise a single metal layer.

25. The light emitting diode of claim 17, wherein the materials of the n-type transparent electrode comprise a plurality of metal layers.

26. The light emitting diode of claim 17, wherein the material of the n-type transparent electrode is selected from a group consisting of aluminum, indium, titanium, tantalum and an alloy of the above listed metals.

27. The light emitting diode of claim 17, wherein the materials of the n-type transparent electrode comprise oxides.

28. The light emitting diode of claim 27, wherein the material of the n-type transparent electrode is selected from a group consisting of indium tin oxide, titanium oxide, nickel oxide, cobalt oxide and a combination of the above listed oxides.

29. The light emitting diode of claim 17, wherein the materials of the n-type transparent electrode comprise nitrides.

30. The light emitting diode of claim 29, wherein the material of the n-type transparent electrode is selected from a group consisting of aluminum nitride, indium nitride, titanium nitride, tantalum nitride and a combination of the above listed nitrides.

31. The light emitting diode of claim 17, wherein the area of the n-type bonding pad is smaller than the area of the n-type transparent electrode.

32. The light emitting diode of claim 17, wherein the area of the p-type bonding pad is smaller than the area of the p-type transparent electrode.

33. A blue light emitting diode, comprising:
a transparent sapphire substrate having a first surface;
an n-type gallium nitride layer disposed on the first surface, wherein the n-type gallium nitride layer having a second surface such that the n-type gallium nitride layer is located between the first surface and the second surface;
a p-type gallium nitride layer disposed on the n-type gallium nitride layer and covers a portion of the second surface, wherein the p-type gallium nitride layer having a third surface such that the p-type gallium nitride layer is located between the second surface and the third surface;
an n-type transparent electrode disposed on the n-type gallium nitride layer, wherein the n-type transparent electrode is arranged alternatively to the p-type gallium nitride layer without connection and covers a portion of the second surface;
a p-type transparent electrode disposed on the p-type gallium nitride layer, such that the p-type gallium nitride layer is located between the n-type gallium nitride layer and the p-type transparent electrode, wherein the p-type transparent electrode covers the third surface completely;

an n-type bonding pad disposed on the n-type transparent electrode and electrically connected to the n-type transparent electrode, wherein the area of the n-type bonding pad is smaller than the area of the n-type transparent electrode; and a p-type bonding pad disposed on the p-type transparent electrode and electrically connected to the p-type transparent electrode, wherein the area of the p-type bonding pad is smaller than the area of the p-type transparent electrode.

34. The blue light emitting diode of claim 33, wherein the structures of the p-type gallium nitride layer comprise a comb-like structure.

35. The blue light emitting diode of claim 34, wherein the structures of the n-type transparent electrode comprise a comb-like structure corresponding and complementary to the p-type gallium nitride layer relatively.

36. The blue light emitting diode of claim 33, wherein the p-type transparent electrode is arranged alternatively to the n-type transparent electrode without connection.

37. The blue light emitting diode of claim 33, wherein the materials of the n-type transparent electrode comprise a single metal layer.

38. The blue light emitting diode of claim 33, wherein the materials of the n-type transparent electrode comprise a plurality of metal layers.

39. The blue light emitting diode of claim 33, wherein the material of the n-type transparent electrode is selected from a group consisting of aluminum, indium, titanium, tantalum and a combination of the above listed metals.

40. The blue light emitting diode of claim 33, wherein the materials of the n-type transparent electrode comprise oxides.

41. The blue light emitting diode of claim 40, wherein the material of the n-type transparent electrode is selected from a group consisting of indium tin oxide, titanium oxide, nickel oxide, cobalt oxide and a combination of the above listed oxides.

42. The blue light emitting diode of claim 33, wherein the materials of the n-type transparent electrode comprise nitrides.

43. The blue light emitting diode of claim 42, wherein the material of the n-type transparent electrode is selected from a group consisting of aluminum nitride, indium nitride, titanium nitride, tantalum nitride and a combination of the above listed nitrides.

* * * * *